United States Patent
Ma et al.

(10) Patent No.: US 11,224,149 B2
(45) Date of Patent: Jan. 11, 2022

(54) HEAT DISSIPATING DEVICE FOR DISPLAY PANEL, MANUFACTURING METHOD THEREOF AND DISPLAY DEVICE

(71) Applicant: BOE TECHNOLOGY GROUP CO., LTD., Beijing (CN)

(72) Inventors: Yongda Ma, Beijing (CN); Xinyin Wu, Beijing (CN); Xueguang Hao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/489,557

(22) PCT Filed: Jan. 30, 2019

(86) PCT No.: PCT/CN2019/073956
§ 371 (c)(1),
(2) Date: Aug. 28, 2019

(87) PCT Pub. No.: WO2019/184591
PCT Pub. Date: Oct. 3, 2019

(65) Prior Publication Data
US 2021/0037683 A1    Feb. 4, 2021

(30) Foreign Application Priority Data
Mar. 27, 2018  (CN) .......................... 201820416869.8

(51) Int. Cl.
*H05K 7/20*  (2006.01)
(52) U.S. Cl.
CPC ........... *H05K 7/20963* (2013.01); *H05K 7/20* (2013.01); *H05K 7/209* (2013.01); *H05K 7/20954* (2013.01)

(58) Field of Classification Search
CPC ...... H05K 7/20963; H05K 7/20; H05K 7/209; H05K 7/20954
(Continued)

(56) References Cited

U.S. PATENT DOCUMENTS 5,982,617 A * 11/1999 Haley ..................... G06F 1/203
                                                                361/679.26
6,052,280 A *  4/2000 Dilley ..................... G06F 1/203
                                                                 165/104.33
(Continued)

FOREIGN PATENT DOCUMENTS

CN           101014821 A       8/2007
CN           203554877 U       4/2014
(Continued)

*Primary Examiner* — Anatoly Vortman
(74) *Attorney, Agent, or Firm* — The Webb Law Firm

(57) ABSTRACT

The present disclosure provides a heat dissipating device for a display panel, a manufacturing method thereof, and a display device. The heat dissipating device may include: a first heat conductor layer located on a side of the display panel away from its display surface, and provided with at least one through hole; and a second heat conductor layer located on a side of the first heat conductor layer away from the display panel, and connected to the display panel through the at least one through hole. A thermal conductivity of the first heat conductor layer in a direction parallel to the display surface and a thermal conductivity of the second heat conductor layer in a direction perpendicular to the display surface are greater than that of the first heat conductor layer in a direction perpendicular to the display surface, respectively.

10 Claims, 6 Drawing Sheets

(58) Field of Classification Search
USPC .......................................................... 361/704
See application file for complete search history.

(56) References Cited

U.S. PATENT DOCUMENTS

| | | | | |
|---|---|---|---|---|
| 6,097,597 | A * | 8/2000 | Kobayashi | F28D 15/0233 165/104.14 |
| 6,689,471 | B2 * | 2/2004 | Gandi | H01L 23/373 428/408 |
| 7,352,582 | B2 * | 4/2008 | Yokoyama | H01L 51/529 361/679.48 |
| 7,561,427 | B2 * | 7/2009 | Jeong | H05K 7/20963 361/690 |
| 8,153,903 | B2 * | 4/2012 | Kanouda | H05K 5/02 174/255 |
| 8,391,010 | B2 * | 3/2013 | Rothkopf | H05K 7/20509 361/708 |
| 8,400,607 | B2 * | 3/2013 | Cappaert | G02B 6/0085 349/161 |
| 8,625,282 | B2 * | 1/2014 | Chen | H05K 7/2039 361/704 |
| 8,636,382 | B2 * | 1/2014 | Omiya | H04N 5/64 362/249.07 |
| 9,049,804 | B2 * | 6/2015 | Lang | H04N 5/64 |
| 2007/0216670 | A1 * | 9/2007 | Yatsu | H05K 7/20963 345/205 |
| 2007/0247807 | A1 * | 10/2007 | Kondo | H01J 5/08 361/688 |
| 2012/0092562 | A1 * | 4/2012 | Omiya | F16B 5/125 348/725 |
| 2014/0160674 | A1 | 6/2014 | Yamakita | |
| 2016/0029511 | A1 | 1/2016 | Jung et al. | |
| 2017/0059145 | A1 | 3/2017 | Li et al. | |
| 2018/0235073 | A1 * | 8/2018 | Ma | G06F 1/203 |

FOREIGN PATENT DOCUMENTS

| | | |
|---|---|---|
| CN | 203590668 U | 5/2014 |
| CN | 107507518 A | 12/2017 |
| CN | 207939941 U | 10/2018 |
| JP | 201171375 A | 4/2011 |
| JP | 2012146828 A | 8/2012 |
| KR | 10-2008-0052878 A | 6/2008 |
| KR | 10-2016-0070243 A | 6/2016 |

* cited by examiner

HEAT DISSIPATING DEVICE FOR DISPLAY PANEL, MANUFACTURING METHOD THEREOF AND DISPLAY DEVICE

CROSS-REFERENCE TO RELATED APPLICATIONS

The present application is a U.S. National Stage Application under 35 U.S.C. § 371 of International Patent Application No. PCT/CN2019/073956, filed on Jan. 30, 2019, which claims priority to China Patent Application No. 201820416869.8, filed on Mar. 27, 2018, the disclosure of both of which are incorporated by reference hereby in entirety.

TECHNICAL FIELD

The present disclosure relates to a heat dissipating device for a display panel, a manufacturing method thereof, and a display device.

BACKGROUND

Display panels generate heat during operation. In the related art, a single heat dissipation layer is used to dissipate heat from the display panel.

SUMMARY

According to an aspect of embodiments of the present disclosure, a heat dissipating device for a display panel is provided. The heat dissipating device comprises: a first heat conductor layer located on a side of the display panel away from a display surface of the display panel, and provided with at least one through hole; and a second heat conductor layer located on a side of the first heat conductor layer away from the display panel, a portion of the second heat conductor layer being connected to the display panel through the at least one through hole; wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

In some embodiments, the thermal conductivity of the first heat conductor layer in the direction parallel to the display surface is greater than a thermal conductivity of the second heat conductor layer in the direction parallel to the display surface.

In some embodiments, the first heat conductor layer comprises a thermally conductive graphite layer; and the second heat conductor layer comprises a metal layer.

In some embodiments, an orthographic projection of the first heat conductor layer on the display panel is located within an orthographic projection of the second heat conductor layer on the display panel, and an edge of the second heat conductor layer is connected to a cover plate for protecting the display panel.

In some embodiments, the heat dissipating device further comprises a third heat conductor layer disposed on a sidewall portion of the cover plate and connected to the second heat conductor layer.

In some embodiments, the third heat conductor layer is located inside a region enclosed by the sidewall portion of the cover plate and is disposed on the sidewall portion of the cover plate in a surrounding manner.

In some embodiments, a projection of the third heat conductor layer on a substrate of the display panel does not overlap with a projection of a display region of the display panel on the substrate.

In some embodiments, the third heat conductor layer comprises at least one of a metal plating layer, a thermally conductive metal patch, a thermally conductive ceramic patch, or a thermally conductive graphite layer.

According to another aspect of embodiments of the present disclosure, a heat dissipating device for a display panel is provided. The heat dissipating device comprises: a first heat conductor layer located on a side of the display panel away from a display surface of the display panel, connected to the display panel through a first connection layer, and provided with at least one through hole; and a second heat conductor layer located on a side of the first heat conductor layer away from the display panel and connected to the first heat conductor layer through a second connection layer, a portion of the second heat conductor layer being connected to the display panel through the at least one through hole; wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

In some embodiments, the thermal conductivity of the first heat conductor layer in the direction parallel to the display surface is greater than a thermal conductivity of the second heat conductor layer in the direction parallel to the display surface.

In some embodiments, the first heat conductor layer comprises a thermally conductive graphite layer; and the second heat conductor layer comprises a metal layer.

In some embodiments, the first connection layer and the second connection layer are both thermally conductive connection layers.

In some embodiments, the first connection layer and the second connection layer are both glue layers.

In some embodiments, an orthographic projection of the first heat conductor layer on the display panel is located within an orthographic projection of the second heat conductor layer on the display panel, and an edge of the second heat conductor layer is connected to a cover plate for protecting the display panel through a portion of the second connection layer.

In some embodiments, the heat dissipating device further comprises a third heat conductor layer disposed on a sidewall portion of the cover plate and connected to the second heat conductor layer through the second connection layer.

In some embodiments, the third heat conductor layer is located inside a region enclosed by the sidewall portion of the cover plate and is disposed on the sidewall portion of the cover plate in a surrounding manner.

In some embodiments, a projection of the third heat conductor layer on a substrate of the display panel does not overlap with a projection of a display region of the display panel on the substrate.

In some embodiments, the third heat conductor layer comprises at least one of a metal plating layer, a thermally conductive metal patch, a thermally conductive ceramic patch, or a thermally conductive graphite layer.

In some embodiments, a portion of the second heat conductor layer passes through the at least one through hole and is connected to the display panel through the first connection layer and the second connection layer.

In some embodiments, the first connection layer is provided with at least one first opening corresponding to the at least one through hole, a portion of the second heat conductor layer passing through the at least one through hole and the at least one first opening and being connected to the display panel through the second connection layer.

In some embodiments, the second connection layer is provided with at least one second opening corresponding to the at least one through hole, a portion of the second heat conductor layer passing through the at least one through hole and the at least one second opening and being connected to the display panel through the first connection layer.

According to another aspect of embodiments of the present disclosure, a heat dissipating device for a display panel is provided. The heat dissipating device comprises: a first heat conductor layer located on a side of the display panel away from a display surface of the display panel; and a second heat conductor layer located on a side of the first heat conductor layer away from the display panel; wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

In some embodiments, the thermal conductivity of the first heat conductor layer in the direction parallel to the display surface is greater than a thermal conductivity of the second heat conductor layer in the direction parallel to the display surface.

In some embodiments, the first heat conductor layer is connected to the display panel through a first connection layer; and the second heat conductor layer is connected to the first heat conductor layer through a second connection layer.

According to another aspect of embodiments of the present disclosure, a display device is provided. The display device comprises a display panel and the heat dissipating device for the display panel as described above.

According to another aspect of embodiments of the present disclosure, a manufacturing method for a heat dissipating device is provided. The manufacturing method comprises: disposing a first heat conductor layer on a side of the display panel away from a display surface of the display panel, wherein the first heat conductor layer is provided with at least one through hole; and disposing a second heat conductor layer on a side of the first heat conductor layer away from the display panel, wherein a portion of the second heat conductor layer is connected to the display panel through the at least one through hole; wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

In some embodiments, the first heat conductor layer is connected to the side of the display panel away from the display surface by a first connection layer; and the second heat conductor layer is connected to the side of the first heat conductor layer away from the display panel by a second connection layer.

In some embodiments, before disposing the second heat conductor layer on the side of the first heat conductor layer away from the display panel, the manufacturing method further comprises: disposing a third heat conductor layer on a sidewall portion of a cover plate for protecting the display panel.

In some embodiments, a projection of the third heat conductor layer on a substrate of the display panel does not overlap with a projection of a display region of the display panel on the substrate.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure will be more clearly understood from the following detailed description with reference to the accompanying drawings, in which.

Figure 1:
FIG. 1 is a schematic cross-sectional view showing a heat dissipating device for a display panel according to an embodiment of the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that since the brightness of a display image is not uniform throughout the entire display panel, the current flowing through electronic components of various sub-pixels for controlling the panel display may be different, resulting in different amount of heat generated in these electronic components. The heat is accumulated in a heat concentration area of the display panel. The accumulation of heat causes a change in the local temperature of the display panel, so that the current flowing through the electronic components is affected by the temperature and produces a certain drift, which may cause a display distortion in the area, thereby affecting the display effect.

In view of this, a heat dissipating device is provided in embodiments of the present disclosure to improve a heat dissipation effect of the display panel. The heat dissipating device according to some embodiments of the present disclosure will be described in detail below with reference to the accompanying drawings.

FIG. 1 is a schematic cross-sectional view showing a heat dissipating device for a display panel according to an embodiment of the present disclosure.

As shown in FIG. 1, the heat dissipating device 10 may comprise a first heat conductor layer 131 and a second heat conductor layer 132.

The first heat conductor layer 131 is located on a side of the display panel 110 away from a display surface of the display panel. The first heat conductor layer 131 is provided with at least one through hole 1312.

As shown in FIG. 1, for example, the display panel 110 may comprise a substrate 111 and an encapsulation layer 112. The first heat conductor layer 131 is disposed on a side of the substrate 111 away from the display surface. For example, The first heat conductor layer 131 may be disposed on a lower surface of the substrate 111. It should be noted that the structure of the display panel shown in FIG. 1 is merely exemplary. Those skilled in the art will appreciate that the display panel may also comprise other structural layers such as a light emitting layer, an integrated circuit layer, etc. Therefore, the structure of the display panel of embodiments of the present disclosure is not limited thereto, which is also true for other figures. It should also be noted that the display surface here refers to the light-emitting surface of the display panel.

The second heat conductor layer 132 is located on a side of the first heat conductor layer 131 away from the display panel 110. A portion of the second heat conductor layer 132 is connected to the display panel through the at least one through hole 1312. For example, The portion of the second heat conductor layer 132 is connected to the substrate 111 of the display panel 110.

A thermal conductivity (also referred to as heat conductivity) of the first heat conductor layer 131 in a direction parallel to the display surface is greater than a thermal conductivity of the first heat conductor layer 131 in a direction perpendicular to the display surface. A thermal conductivity of the second heat conductor layer 132 in the direction perpendicular to the display surface is greater than the thermal conductivity of the first heat conductor layer 131 in the direction perpendicular to the display surface.

In the heat dissipating device of the above embodiment, the first heat conductor layer is disposed on a side of the display panel away from the display surface. The first heat conductor layer is provided with at least one through hole. The second heat conductor layer is disposed on a side of the first heat conductor layer away from the display panel. A portion of the second heat conductor layer is connected to the display panel through the at least one through hole. A thermal conductivity of the first heat conductor layer in a direction parallel to the display surface is greater than a thermal conductivity of the first heat conductor layer in a direction perpendicular to the display surface. This may make the distribution of heat of the display panel relatively uniform in the direction parallel to the display surface, preventing heat from being accumulated in a certain area, which is favorable to the improvement of the heat dissipation effect of the display panel. A thermal conductivity of the second heat conductor layer in a direction perpendicular to the display surface is greater than the thermal conductivity of the first heat conductor layer in a direction perpendicular to the display surface. This may enable the uniformly distributed heat of the display panel to be transferred to the outside through the second heat conductor layer in the direction perpendicular to the display surface, thereby improving the heat dissipation effect of the display panel.

In some embodiments, the thermal conductivity of the first heat conductor layer 131 in the direction parallel to the display surface is greater than a thermal conductivity of the second heat conductor layer 132 in the direction parallel to the display surface. This may make the distribution of heat of the display panel more uniform in the direction parallel to the display surface, which is favorable to the improvement of the heat dissipation effect.

In some embodiments, the first heat conductor layer 131 may comprise a thermally conductive graphite layer. For example, the first heat conductor layer 131 may comprise a graphene layer. In some embodiments, the second heat conductor layer 132 may comprise a metal layer. For example, the second heat conductor layer may comprise at least one of a metal plating layer or a thermally conductive metal patch. For example, the second heat conductor layer may be a copper foil or a stainless steel sheet, etc.

It should be noted that FIG. 1 shows two heat conductor layers disposed on a side of the display panel away from the display surface. However, the scope of the embodiments of the present disclosure is not limited thereto. For example, more heat conductor layers, such as three layers, four layers, etc., may be disposed on a side of the display panel away from the display surface. For example, among these heat conductor layers, the heat conduction performance (for example, thermal conductivity) of a heat conductor layer close to the display panel in a direction parallel to the display surface is better than that of a heat conductor layer away from the display panel; and the heat conduction performance of the heat conductor layer away from the display panel in a direction perpendicular to the display surface is better than that of the heat conductor layer close to the display panel. This is beneficial to improve the heat dissipation effect of the display panel.

Figure 2:
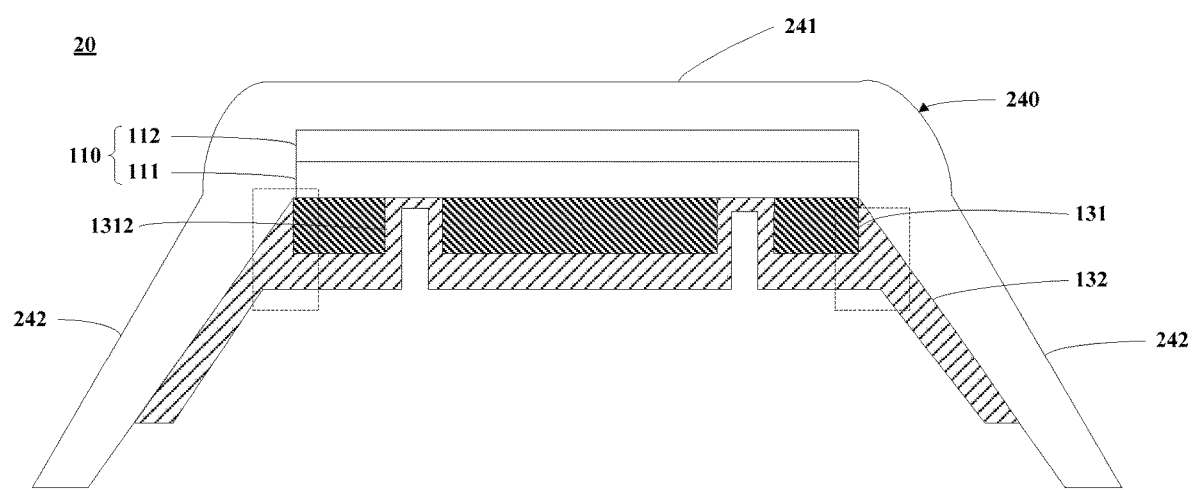
FIG. 2 is a schematic cross-sectional view showing a heat dissipating device for a display panel according to another embodiment of the present disclosure.

FIG. 2 is a schematic cross-sectional view showing a heat dissipating device for a display panel according to another embodiment of the present disclosure.

Similar to the structure shown in FIG. 1, the heat dissipating device 20 shown in FIG. 2 comprises a first heat conductor layer 131 and a second heat conductor layer 132. The first heat conductor layer 131 is connected to the display panel 110. The first heat conductor layer 131 is provided with at least one through hole 1312. The second heat conductor layer 132 is connected to the first heat conductor layer 131. A portion of the second heat conductor layer 132 is connected to the substrate 111 of the display panel 110 through the at least one through hole 1312.

In some embodiments, an orthographic projection of the first heat conductor layer 131 on the display panel 110 is located within an orthographic projection of the second heat conductor layer 132 on the display panel 110. That is, the orthographic projection of the second heat conductor layer 132 on the display panel 110 completely covers the orthographic projection of the first heat conductor layer 131 on the display panel 110. In other words, the edge of the second heat conductor layer 132 exceeds the edge of the first heat conductor layer 131, as shown in the dotted box in FIG. 2 (reference may also be made to FIG. 7). Or, in other words, the edge of the second heat conductor layer 132 covers the edge of the first heat conductor layer 131.

In addition, a cover plate 240 is also shown in FIG. 2. The cover plate 240 may be used to protect the display panel 110. As shown in FIG. 2, the cover plate 240 may comprise a main body portion 241 that covers the display panel 110 and a sidewall portion 242 that is connected to the main body portion. In some embodiments, as shown in FIG. 2, the edge of the second heat conductor layer 132 is connected to the cover plate 240. As shown in FIG. 2, the second heat conductor layer 132 may comprise a portion that extends along a side surface of the sidewall portion of the cover plate 240, and that is connected to the cover plate 240. By connecting the second heat conductor layer to the cover plate, heat of the display panel that is accumulated on the sidewall portion of the cover plate may be transferred to the outside, thereby improving the heat dissipation effect of the display panel.

Figure 3:
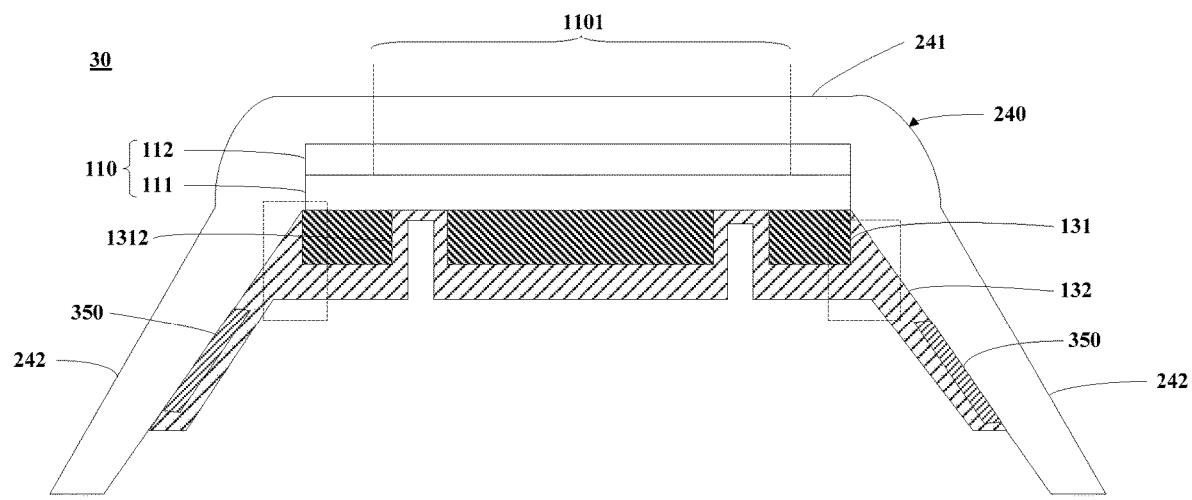
FIG. 3 is a schematic cross-sectional view showing a heat dissipating device for a display panel according to still another embodiment of the present disclosure.

FIG. 3 is a schematic cross-sectional view showing a heat dissipating device for a display panel according to still another embodiment of the present disclosure. The structure shown in FIG. 3 is substantially similar to the structure shown in FIG. 2. Here, structures in FIG. 3 that are the same or similar to those shown in FIG. 2 will not be described again.

In some embodiments, as shown in FIG. 3, in addition to the first heat conductor layer 131 and the second heat conductor layer 132, a heat dissipating device 30 may further comprise a third heat conductor layer 350. The third heat conductor layer 350 is disposed on the sidewall portion 242 of the cover plate 240. The third heat conductor layer 350 is on a portion of the cover plate 240 close to its edge. The third heat conductor layer 350 may be connected to the second heat conductor layer 132. For example, an area of the side surface of the sidewall portion of the cover plate is larger than an area of an edge side surface of the display panel. By providing the third heat conductor layer on the sidewall portion of the cover plate, the radiation area of the cover plate radiating heat to the outside may be increased, so that a good heat dissipation effect is achieved.

In some embodiments, the third heat conductor layer 350 is located inside a region enclosed by the sidewall portion 242 of the cover plate 240 and is disposed on the sidewall portion 242 of the cover plate 240 in a surrounding manner. In this way, a better heat dissipation effect may be achieved.

In some embodiments, the third heat conductor layer 350 may further extend beyond a connecting portion (not shown) between the sidewall portion 242 and the main body portion 241 such that a portion of the third heat conductor layer may be on an upper surface of the display panel 110. In this way, the heat dissipation effect may be further improved.

In some embodiments, as shown in FIG. 3, the display panel 110 comprises a display region 1101. A projection of the third heat conductor layer 350 on the substrate 111 of the display panel 110 does not overlap with a projection (e.g., an orthographic projection) of the display region 1101 of the display panel on the substrate 111.

In some embodiments, the third heat conductor layer 350 may comprise at least one of a metal plating layer (e.g., copper or the like), a thermally conductive metal patch, a thermally conductive ceramic patch, or a thermally conductive graphite layer (e.g., a graphene layer).

Figure 4A:
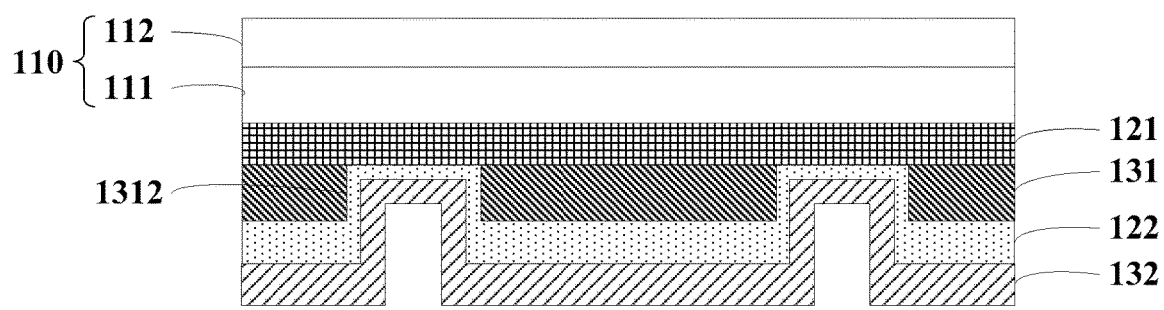
FIG. 4A is a schematic cross-sectional view showing a heat dissipating device for a display panel according to still another embodiment of the present disclosure.

FIG. 4A is a schematic cross-sectional view showing a heat dissipating device for a display panel according to still another embodiment of the present disclosure.

As shown in FIG. 4A, a heat dissipating device 40 may comprise a first heat conductor layer 131 and a second heat conductor layer 132.

The first heat conductor layer 131 is located on a side of the display panel 110 away from a display surface of the display panel, and is connected to the display panel 110 through the first connection layer 121. The first heat conductor layer 131 is provided with at least one through hole 1312.

The second heat conductor layer 132 is located on a side of the first heat conductor layer 131 away from the display panel 110. The second heat conductor layer 132 is connected to the first heat conductor layer 131 through a second connection layer 122. A portion of the second heat conductor layer 132 is connected to the display panel 110 through the at least one through hole 1312, for example, to the substrate 111 of the display panel 110. A thermal conductivity of the first heat conductor layer 131 in a direction parallel to the display surface is greater than a thermal conductivity of the first heat conductor layer 131 in a direction perpendicular to the display surface. A thermal conductivity of the second heat conductor layer 132 in the direction perpendicular to the display surface is greater than the thermal conductivity of the first heat conductor layer 131 in the direction perpendicular to the display surface.

In the heat dissipating device of the above embodiment, the first heat conductor layer is connected to the side of the display panel away from the display surface by the first connecting layer. The first heat conductor layer is provided with at least one through hole. The second heat conductor layer is connected to the side of the first heat conductor layer away from the display panel by the second connection layer. A portion of the second heat conductor layer is connected to the display panel through the at least one through hole. A thermal conductivity of the first heat conductor layer in a direction parallel to the display surface is greater than a thermal conductivity of the first heat conductor layer in a direction perpendicular to the display surface. This may make the distribution of heat of the display panel relatively uniform in the direction parallel to the display surface, preventing heat from being accumulated in a certain area, which is favorable to the improvement of the heat dissipation effect. A thermal conductivity of the second heat conductor layer in a direction perpendicular to the display surface is greater than the thermal conductivity of the first heat conductor layer in a direction perpendicular to the display surface. This may enable the uniformly distributed heat of the display panel to be transferred to the outside through the second heat conductor layer in the direction perpendicular to the display surface, thereby improving the heat dissipation effect. The heat dissipating device may make the heat dissipation of the display panel easy in different directions, thereby improving the heat dissipation effect of the display panel.

A display panel produces different amounts of heat in different areas during operation. Different amount of heat accumulated in different areas will cause different temperature zones on the panel, which will affect the display effect of an image. In the related art, a single heat dissipation layer is used to dissipate heat from the display panel, but the heat dissipation effect of the single heat dissipation layer is limited. In embodiments of the present disclosure, different heat conductor layers are disposed on a side of a lower substrate of the display panel away from the display surface. Since the different materials of the heat conductor layers have different heat conduction performance in different heat conducting directions, providing different heat conductor layers may take into account the heat conduction effect in different directions. This may improve the heat dissipation effect of the display panel.

In some embodiments, the thermal conductivity of the first heat conductor layer 131 in the direction parallel to the display surface is greater than a thermal conductivity of the second heat conductor layer 132 in the direction parallel to the display surface. In this embodiment, the heat conduction performance of the first heat conductor layer in the direction parallel to the display surface is better than that of the second heat conductor layer, which may make the heat distribution of the display panel relatively uniform in the direction parallel to the display surface, which may prevent heat from accumulating in a certain area. Since the heat conduction performance of the second heat conductor layer in the direction perpendicular to the display surface is better than that of the first heat conductor layer, the uniformly distributed heat of the display panel may be transferred to the outside through the second heat conductor layer in the direction perpendicular to the display surface, thereby improving the heat dissipation effect of the display panel.

In some embodiments, the first heat conductor layer 131 may comprise a thermally conductive graphite layer. For example, the first heat conductor layer 131 may comprise a graphene layer. In some embodiments, the second heat conductor layer 132 may comprise a metal layer. For example, the second heat conductor layer may comprise at least one of a metal plating layer or a thermally conductive metal patch. For example, the second heat conductor layer may be a copper foil or a stainless steel sheet, etc.

In some embodiments, the first connection layer 121 and the second connection layer 122 are both thermally conductive connection layers. For example, the first connection layer 121 and the second connection layer 122 may both be glue layers. In general, the glue layer serving as the first connection layer or the second connection layer is relatively thin (for example, several micrometers to ten and several micrometers), so that heat may be easily transferred.

In some embodiments, as shown in FIG. 4A, a portion of the second heat conductor layer 132 passes through the at least one through hole 1312 and is connected to the display panel 110 through the first connection layer 121 and the second connection layer 122. For example, as shown in FIG. 4A, the second heat conductor layer 132 may comprise at least one protruding portion that passes through the at least one through hole 1312. At the through hole 1312, the protruding portion may be connected to the substrate 111 of the display panel 110 through the first connection layer 121 and the second connection layer 122. By connecting the second heat conductor layer to the display panel, the heat of the display panel may be easily transmitted to the outside along the second heat conductor layer, thereby improving the heat dissipation effect of the display panel.

Figure 4B:
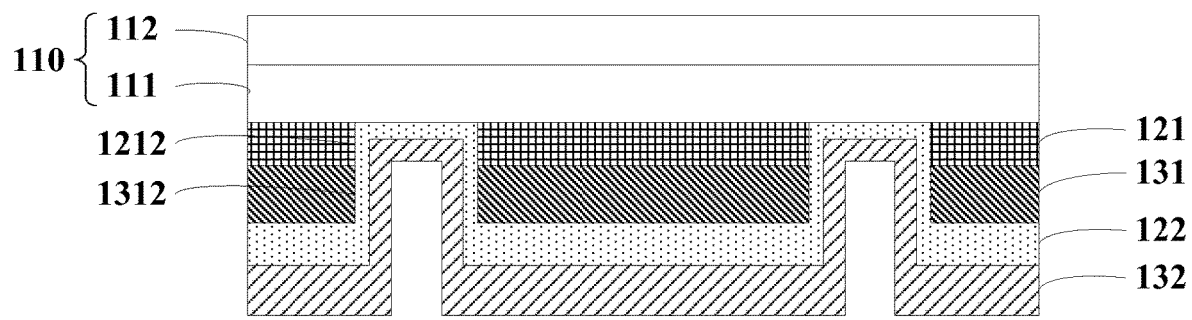
FIG. 4B is a schematic cross-sectional view showing a heat dissipating device for a display panel according to still another embodiment of the present disclosure.

FIG. 4B is a schematic cross-sectional view showing a heat dissipating device for a display panel according to still another embodiment of the present disclosure.

The structure of the heat dissipating device 40' shown in FIG. 4B is substantially similar to the structure of the heat dissipating device 40 shown in FIG. 4A. The structure of the heat dissipating device 40' shown in FIG. 4B is different from the structure of the heat dissipating device 40 shown in FIG. 4A in that the first connection layer 121 is provided with at least one first opening 1212 corresponding to the at least one through hole 1312. For example, the first opening 1212 is aligned with a corresponding through hole 1312. A portion of the second heat conductor layer 132 passes through the at least one through hole 1312 and the at least one first opening 1212 and is connected to the display panel 110 through the second connection layer 122. For example, as shown in FIG. 4B, the second heat conductor layer 132 may comprise at least one protruding portion that passes through the at least one through hole 1312 and the at least one first opening 1212. The protruding portion may be connected to the substrate 111 of the display panel 110 through the second connection layer 122. By connecting the second heat conductor layer to the display panel, the heat of the display panel may be easily transmitted to the outside along the second heat conductor layer, thereby improving the heat dissipation effect of the display panel.

Figure 4C:
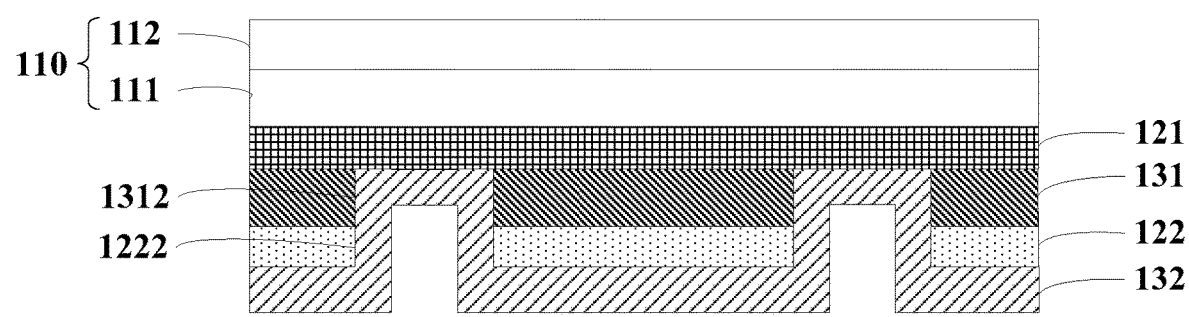
FIG. 4C is a schematic cross-sectional view showing a heat dissipating device for a display panel according to still another embodiment of the present disclosure.

FIG. 4C is a schematic cross-sectional view showing a heat dissipating device for a display panel according to still another embodiment of the present disclosure.

The structure of the heat dissipating device 40″ shown in FIG. 4C is substantially similar to the structure of the heat dissipating device 40 shown in FIG. 4A. The structure of the heat dissipating device 40″ shown in FIG. 4C is different from the structure of the heat dissipating device 40 shown in FIG. 4A in that the second connection layer 122 is provided with at least one second opening 1222 corresponding to the at least one through hole 1312. For example, the first opening 1212 is aligned with a corresponding through hole 1312. A portion of the second heat conductor layer 132 passes through the at least one through hole 1312 and the at least one second opening 1222 and is connected to the display panel 110 through the first connection layer 121. For example, as shown in FIG. 4C, the second heat conductor layer 132 may comprise at least one protruding portion that passes through the at least one through hole 1312 and the at least one second opening 1222. The protruding portion may be connected to the substrate 111 of the display panel 110 through the first connection layer 121. By connecting the second heat conductor layer to the display panel, the heat of the display panel may be easily transmitted to the outside along the second heat conductor layer, thereby improving the heat dissipation effect of the display panel.

Figure 5:
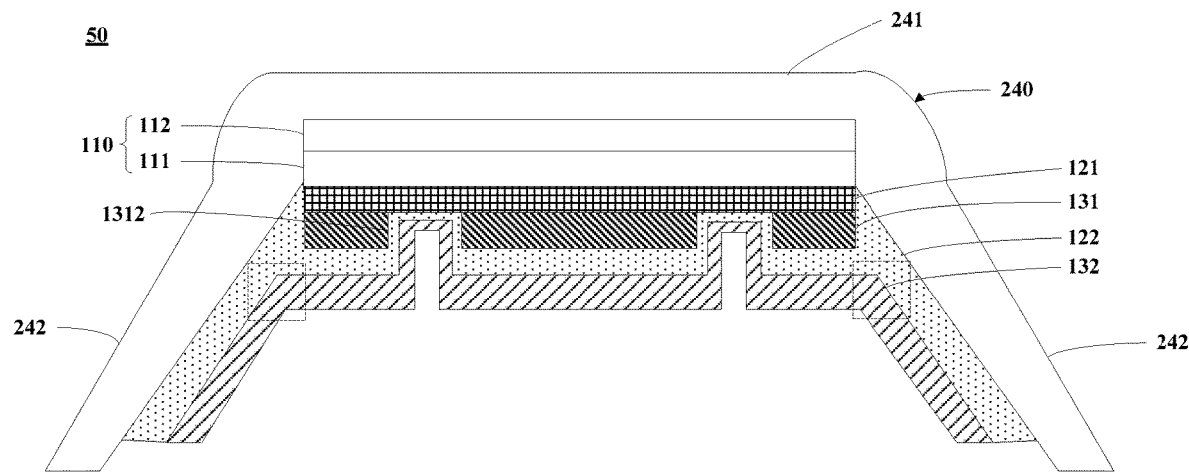
FIG. 5 is a schematic cross-sectional view showing a heat dissipating device for a display panel according to still another embodiment of the present disclosure.

FIG. 5 is a schematic cross-sectional view showing a heat dissipating device for a display panel according to still another embodiment of the present disclosure.

Similar to the structure shown in FIG. 4A, a heat dissipating device 50 shown in FIG. 5 comprises a first heat conductor layer 131 and a second heat conductor layer 132. The first heat conductor layer 131 is connected to a display panel 110 through a first connection layer 121. The first heat conductor layer 131 is provided with at least one through hole 1312. The second heat conductor layer 132 is connected to the first heat conductor layer 131 through a second connection layer 122. A portion of the second heat conductor layer 132 is connected to a substrate 111 of the display panel 110 through the at least one through hole 1312.

In some embodiments, an orthographic projection of the first heat conductor layer 131 on the display panel is located within an orthographic projection of the second heat conductor layer 132 on the display panel. In other words, the edge of the second heat conductor layer 132 exceeds the edge of the first heat conductor layer 131, as shown in the dotted box in FIG. 5 (reference may also be made to FIG. 7). Or, in other words, the edge of the second heat conductor layer contactlessly covers the edge of the first heat conductor layer.

In addition, a cover plate 240 is also shown in FIG. 5. In some embodiments, as shown in FIG. 5, the edge of the second heat conductor layer 132 is connected to the cover plate 240 for protecting the display panel 110 by a portion of the second connection layer 122. As shown in FIG. 5, the second heat conductor layer 132 may comprise a portion that extends along a side surface of the sidewall portion 242 of the cover plate 240. This extended portion is connected to the cover plate 240 by a portion of the second connection layer 122. By connecting the second heat conductor layer to the cover plate, heat of the display panel that is accumulated on the sidewall portion of the cover plate may be transferred to the outside, thereby improving the heat dissipation effect of the display panel.

In some embodiments, at the edge of the first connection layer 121, the second connection layer 122 is connected to the first connection layer 121, as shown in FIG. 5. By connecting the second connection layer 122 to the first connection layer 121, the heat of the display panel may be transmitted uniformly, resulting in a better heat dissipation effect. In addition, the first heat conductor layer may be connected to the second heat conductor layer more securely.

Figure 6:
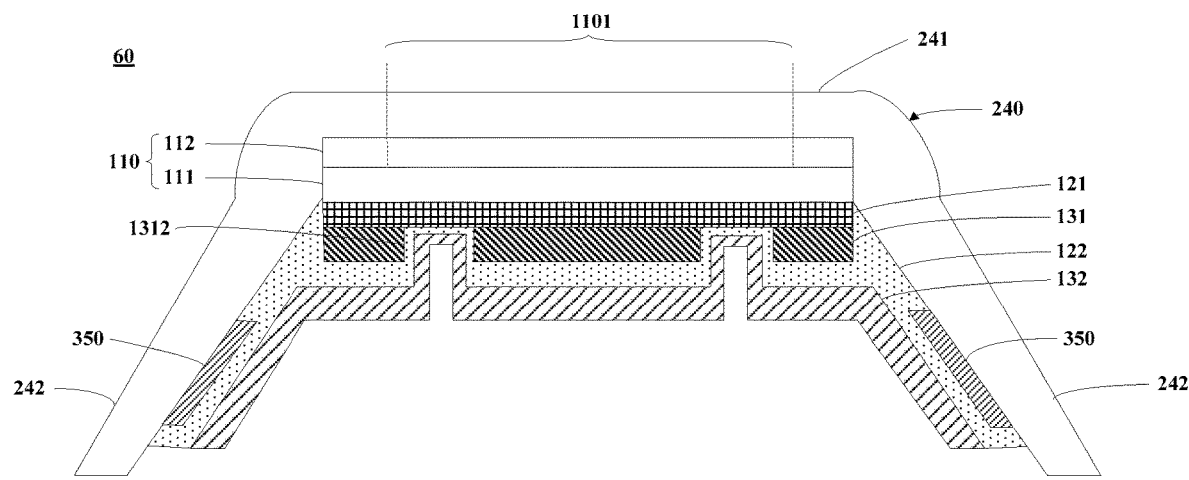
FIG. 6 is a schematic cross-sectional view showing a heat dissipating device for a display panel according to still another embodiment of the present disclosure.

FIG. 6 is a schematic cross-sectional view showing a heat dissipating device for a display panel according to still another embodiment of the present disclosure. The structure shown in FIG. 6 is substantially similar to the structure shown in FIG. 5. Here, structures in FIG. 6 that are the same or similar to those shown in FIG. 5 will not be described again.

In some embodiments, as shown in FIG. 6, in addition to the first heat conductor layer 131 and the second heat conductor layer 132, a heat dissipating device 60 may further comprise a third heat conductor layer 350. The third heat conductor layer 350 may be disposed on the sidewall portion 242 of the cover plate 240. The third heat conductor layer 350 is disposed on a portion of the cover plate 240 close to its edge. The third heat conductor layer 350 may be connected to the second heat conductor layer 132 through the second connection layer 122. For example, an area of a side surface of the sidewall portion of the cover plate is larger than an area of an edge side surface of the display panel. By providing a third heat conductor layer on the sidewall portion of the cover plate, a radiation area of the cover plate radiating heat to the outside may be increased, so that a good heat dissipation effect is achieved.

In some embodiments, the third heat conductor layer 350 is located inside a region enclosed by the sidewall portion 242 of the cover plate 240 and is disposed on the sidewall portion 242 of the cover plate 240 in a surrounding manner. In this way, a better heat dissipation effect may be achieved.

In some embodiments, the third heat conductor layer 350 may further extend beyond a connecting portion (not shown) between the sidewall portion 242 and the main body portion 241 such that a portion of the third heat conductor layer may be on an upper surface of the display panel 110. In this way, the heat dissipation effect may be further improved.

In some embodiments, as shown in FIG. 6, a projection of the third heat conductor layer 350 on a substrate 111 of the display panel 110 does not overlap with a projection of a display region 1101 of the display panel on the substrate 111.

In some embodiments, the third heat conductor layer 350 may comprise at least one of a metal plating layer (e.g., copper or the like), a thermally conductive metal patch, a thermally conductive ceramic patch, or a thermally conductive graphite layer (e.g., a graphene layer).

Figure 7:
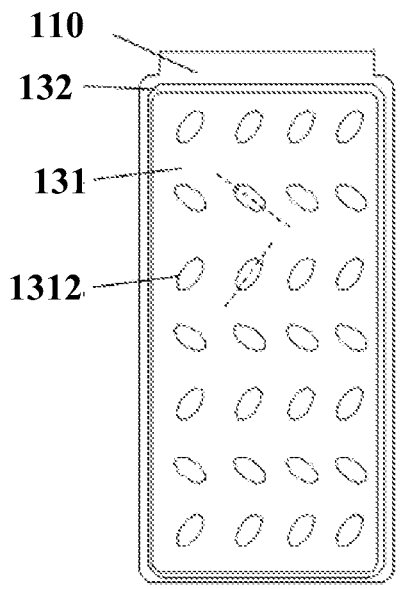
FIG. 7 is a top view showing a heat dissipating device for a display panel according to still another embodiment of the present disclosure.

FIG. 7 is a top view showing a heat dissipating device for a display panel according to still another embodiment of the present disclosure. As shown in FIG. 7, the edge of the second heat conductor layer 132 exceeds the edge of the first heat conductor layer 131. In other words, the orthographic projection of the first heat conductor layer 131 on the display panel 110 is located within the orthographic projection of the second heat conductor layer 132 on the display panel 110. The first heat conductor layer 131 is provided with a plurality of through holes 1312. For example, the plurality of through holes 1312 may be designed as a through-hole array. By providing a relatively large number of through holes on the first heat conductor layer, the second heat conductor layer may be sufficiently in contact with the display panel, which is more advantageous for the heat dissipation of the display panel.

In some embodiments of the present disclosure, a display device is provided. The display device comprises a display panel and a heat dissipating device for the display panel as described above (e.g., the heat dissipating device shown in FIG. 1, FIG. 2, FIG. 3, FIG. 4A, FIG. 4B, FIG. 4C, FIG. 5 or FIG. 6). The heat dissipating device may be disposed on a side of the display panel away from the display surface. The display device may be any product or component having a display function such as an electronic paper, a mobile phone, a tablet computer, a television, a display, a notebook computer, a digital photo frame, or a navigator.

Figure 8:
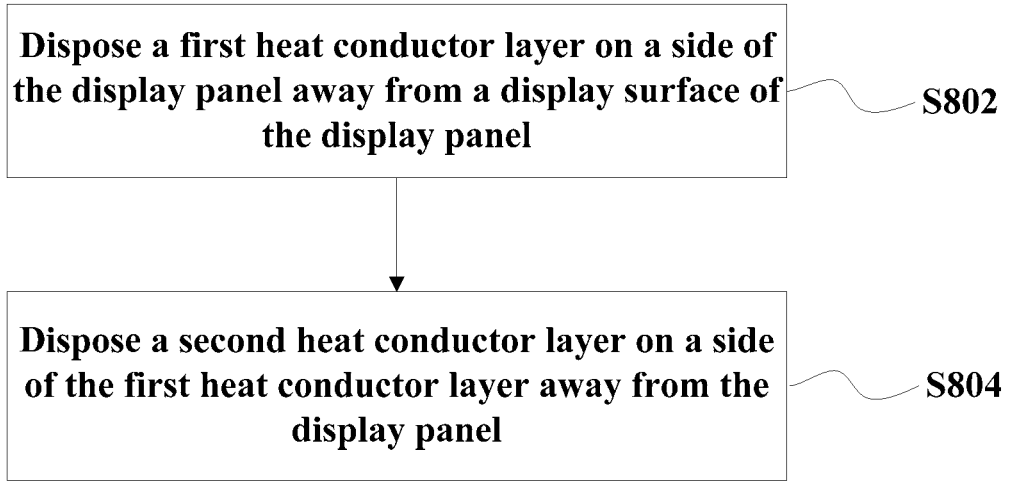
FIG. 8 is a flowchart illustrating a manufacturing method for a heat dissipating device for a display panel according to an embodiment of the present disclosure.

FIG. 8 is a flowchart illustrating a manufacturing method for a heat dissipating device for a display panel according to an embodiment of the present disclosure.

As shown in FIG. 8, in step S802, a first heat conductor layer is disposed on a side of a display panel away from display surface of the display panel. The first heat conductor layer is provided with at least one through hole.

Figure 9:
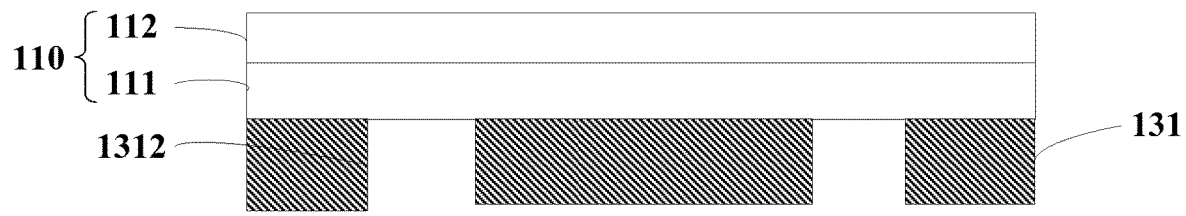
FIG. 9 is a schematic cross-sectional view of a structure obtained in step S802 of FIG. 8 according to an embodiment of the present disclosure.

For example, FIG. 9 is a schematic cross-sectional view of a structure obtained in step S802 of FIG. 8 according to an embodiment of the present disclosure. For example, as shown in FIG. 9, a first heat conductor layer 131 may be formed on a side of a display panel 110 away from its display surface by a process such as deposition. Then, at least one through hole 1312 is formed in the first heat conductor layer 131 by a process such as etching or the like.

Figure 10:
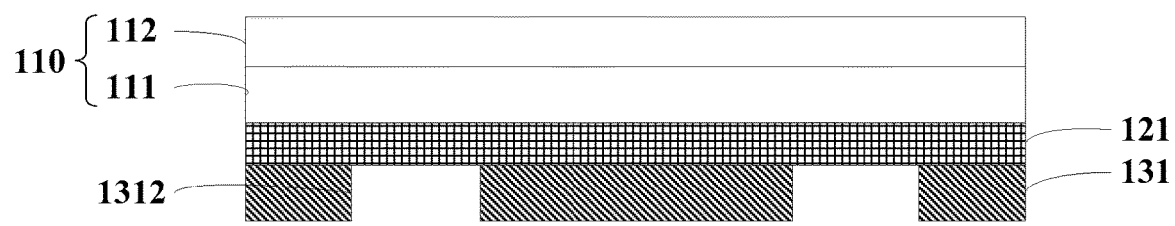
FIG. 10 is a schematic cross-sectional view of a structure obtained in step S802 of FIG. 8 according to another embodiment of the present disclosure.

For example, FIG. 10 is a schematic cross-sectional view of a structure obtained in step S802 of FIG. 8 according to another embodiment of the present disclosure. For example, as shown in FIG. 10, a first heat conductor layer 131 is connected to a side of a display panel 110 away from its display surface by a first connection layer 121. For example, the first heat conductor layer 131 may be connected to the substrate 111 of the display panel. The first heat conductor layer 131 is provided with at least one through hole 1312.

For example, the through hole 1312 may be formed in the first heat conductor layer 131 by a process such as etching, cutting or the like, and then the first heat conductor layer 131 having the through hole formed therein is connected to a side of the display panel 110 away from its display surface by the first connection layer 121, thereby forming the structure shown in FIG. 10.

For another example, the first heat conductor layer 131 may be connected to a side of the display panel 110 away from the display surface by the first connecting layer 121, and then at least one through hole 1312 is formed in the first heat conductor layer 131 by a process such as etching or the like, thereby forming the structure shown in FIG. 10.

Returning to FIG. 8, in step S804, a second heat conductor layer is disposed on a side of the first heat conductor layer away from the display panel. A portion of the second heat conductor layer is connected to the display panel through the at least one through hole.

For example, FIG. 1 is a schematic cross-sectional view of a structure obtained in step S804 of FIG. 8 according to some embodiments of the present disclosure. For example, as shown in FIG. 1, a second heat conductor layer 132 is formed on a side of the first heat conductor layer 131 away from the display panel 110 by a process such as deposition. A portion of the second heat conductor layer 132 is connected to the display panel 110 through the at least one through hole 1312.

For another example, FIG. 4A is a schematic cross-sectional view of a structure obtained in step S804 of FIG. 8 according to other embodiments of the present disclosure. As shown in FIG. 4A, the second heat conductor layer 132 is connected to a side of the first heat conductor layer 131 away from the display panel 110 by a second connection layer 122. A portion of the second heat conductor layer 132 is connected to the display panel 110 through the at least one through hole 1312.

A thermal conductivity of the first heat conductor layer 131 in a direction parallel to the display surface is greater than a thermal conductivity of the first heat conductor layer 131 in a direction perpendicular to the display surface. A thermal conductivity of the second heat conductor layer 132 in the direction perpendicular to the display surface is greater than the thermal conductivity of the first heat conductor layer 131 in the direction perpendicular to the display surface.

In the manufacturing method of the above embodiment, a first heat conductor layer is disposed on a side of a display panel away from a display surface of the display panel. The first heat conductor layer is provided with at least one through hole. In the method, a second heat conductor layer is further disposed on a side of the first heat conductor layer away from the display panel. A portion of the second heat conductor layer is connected to the display panel through the at least one through hole. By the above manufacturing method, a heat dissipating device for a display panel according to some embodiments of the present disclosure is formed. In the heat dissipating device, a thermal conductivity of the first heat conductor layer in a direction parallel to the display surface is greater than the thermal conductivity of the first heat conductor layer in a direction perpendicular to the display surface. This may make the distribution of heat of the display panel relatively uniform in the direction parallel to the display surface, preventing heat from being accumulated in a certain area, which is favorable to the improvement of the heat dissipation effect. Moreover, a thermal conductivity of the second heat conductor layer in a direction perpendicular to the display surface is greater than the thermal conductivity of the first heat conductor layer in a direction perpendicular to the display surface. This may enable the uniformly distributed heat of the display panel to be transferred to the outside through the second heat conductor layer in a direction perpendicular to the display surface, thereby improving the heat dissipation effect of the display panel.

In some embodiments, before step S804, the manufacturing method may further comprise: disposing a third heat conductor layer on a sidewall portion of a cover plate for protecting the display panel. For example, the third heat conductor layer may be formed on the sidewall portion of the cover plate by processes such as deposition and etching. For example, the third heat conductor layer may be connected to the second heat conductor layer by the second connection layer. In some embodiments, inside a region enclosed by the sidewall portion of the cover plate, the third heat conductor layer may be disposed on the sidewall portion of the cover plate in a surrounding manner. For example, a projection of the third heat conductor layer on a substrate of the display panel does not overlap with a projection of a display region of the display panel on the substrate. By providing the third heat conductor layer on the sidewall portion of the cover plate, a better heat dissipation effect may be achieved.

In the heat dissipating device described above, the first heat conductor layer is provided with at least one through hole. In other embodiments, it is possible to provide the first heat conductor layer without a through hole. A heat dissipating device according to still other embodiments of the present disclosure will be described below with reference to FIG. 11.

Figure 11:
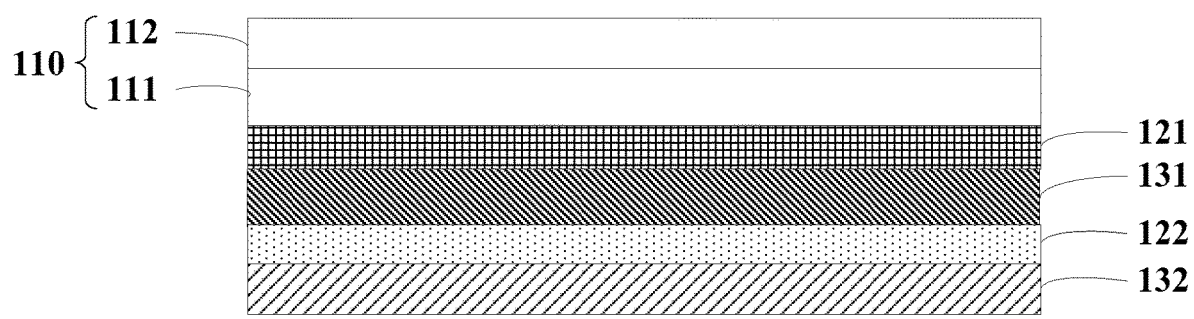
FIG. 11 is a schematic cross-sectional view showing a heat dissipating device for a display panel according to still another embodiment of the present disclosure.

FIG. 11 is a schematic cross-sectional view showing a heat dissipating device for a display panel according to still another embodiment of the present disclosure.

As shown in FIG. 11, the heat dissipating device may comprise a first heat conductor layer 131 and a second heat conductor layer 132.

As shown in FIG. 11, the first heat conductor layer 131 is located on a side of a display panel 110 away from a display surface of the display panel. For example, as shown in FIG. 11, the display panel 110 may comprise a substrate 111 and an encapsulation layer 112. The first heat conductor layer 131 may be disposed on a side of the substrate 111 away from the display surface. For example, the first heat conductor layer 131 may be disposed on a lower surface of the substrate 111. The second heat conductor layer 132 is located on a side of the first heat conductor layer 131 away from the display panel 110. A thermal conductivity of the first heat conductor layer 131 in a direction parallel to the display surface is greater than a thermal conductivity of the first heat conductor layer 131 in a direction perpendicular to the display surface. A thermal conductivity of the second heat conductor layer 132 in the direction perpendicular to the display surface is greater than the thermal conductivity of the first heat conductor layer 131 in the direction perpendicular to the display surface.

For example, the first heat conductor layer 131 may comprise a thermally conductive graphite layer, and the second heat conductor layer 132 may comprise a metal layer. For example, the thermally conductive graphite layer having a thermal conductivity characteristic of the first heat conductor layer may be prepared by a known process, or the metal layer (for example, a copper foil or a stainless steel sheet, etc.) having a thermal conductivity characteristic of the second heat conductor layer may be prepared by a known process.

In the heat dissipating device of the above embodiment, the first heat conductor layer is disposed on a side of the display panel away from the display surface, and the second heat conductor layer is disposed on a side of the first heat conductor layer away from the display panel. A thermal conductivity of the first heat conductor layer in a direction parallel to the display surface is greater than a thermal conductivity of the first heat conductor layer in a direction perpendicular to the display surface. This may make the distribution of heat of the display panel relatively uniform in the direction parallel to the display surface, preventing heat from being accumulated in a certain area, which is favorable to the improvement of the heat dissipation effect. A thermal conductivity of the second heat conductor layer in the direction perpendicular to the display surface is greater than the thermal conductivity of the first heat conductor layer in the direction perpendicular to the display surface. This may enable the uniformly distributed heat of the display panel to be transferred to the outside through the second heat conductor layer in the direction perpendicular to the display surface, thereby improving the heat dissipation effect of the display panel.

In some embodiments, the thermal conductivity of the first heat conductor layer 131 in the direction parallel to the display surface is greater than a thermal conductivity of the second heat conductor layer 132 in the direction parallel to the display surface.

In some embodiments, as shown in FIG. 11, the first heat conductor layer 131 is connected to the display panel 110 through a first connection layer 121. The second heat conductor layer 132 is connected to the first heat conductor layer 131 through a second connection layer 122. Certainly, the scope of the embodiments of the present disclosure is not limited thereto. For example, the first heat conductor layer 131 may also be directly connected to the display panel 110 without the first connection layer, and the second heat conductor layer 132 may also be directly connected to the first heat conductor layer 131 without the second connection layer.

In some embodiments of the present disclosure, a display device is further provided. The display device may comprise a display panel and a heat dissipating device for the display panel as shown in FIG. 11.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:

1. A heat dissipating device for a display panel, comprising:
    a first heat conductor layer located on a side of the display panel away from a display surface of the display panel, connected to the display panel through a first connection layer, and provided with at least one through hole; and
    a second heat conductor layer located on a side of the first heat conductor layer away from the display panel and connected to the first heat conductor layer through a second connection layer, a portion of the second heat conductor layer being connected to the display panel through the at least one through hole;
    wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

2. The heat dissipating device according to claim 1, wherein
    the thermal conductivity of the first heat conductor layer in the direction parallel to the display surface is greater than a thermal conductivity of the second heat conductor layer in the direction parallel to the display surface.

3. The heat dissipating device according to claim 1, wherein
the first connection layer and the second connection layer are both thermally conductive connection layers.

4. The heat dissipating device according to claim 1, wherein
an orthographic projection of the first heat conductor layer on the display panel is located within an orthographic projection of the second heat conductor layer on the display panel, and an edge of the second heat conductor layer is connected to a cover plate for protecting the display panel through a portion of the second connection layer.

5. The heat dissipating device according to claim 4, further comprising:
a third heat conductor layer disposed on a sidewall portion of the cover plate and connected to the second heat conductor layer through the second connection layer.

6. The heat dissipating device according to claim 5, wherein
the third heat conductor layer is located inside a region enclosed by the sidewall portion of the cover plate and is disposed on the sidewall portion of the cover plate in a surrounding manner.

7. The heat dissipating device according to claim 1, wherein
a portion of the second heat conductor layer passes through the at least one through hole and is connected to the display panel through the first connection layer and the second connection layer.

8. A manufacturing method for a heat dissipating device according to claim 1, comprising:
disposing a first heat conductor layer on a side of the display panel away from a display surface of the display panel, wherein the first heat conductor layer is provided with at least one through hole; and
disposing a second heat conductor layer on a side of the first heat conductor layer away from the display panel, wherein a portion of the second heat conductor layer is connected to the display panel through the at least one through hole;
wherein a thermal conductivity of the first heat conductor layer in a direction parallel to the display surface is greater than a thermal conductivity of the first heat conductor layer in a direction perpendicular to the display surface; and a thermal conductivity of the second heat conductor layer in the direction perpendicular to the display surface is greater than the thermal conductivity of the first heat conductor layer in the direction perpendicular to the display surface.

9. The manufacturing method according to claim 8, wherein
the first heat conductor layer is connected to the side of the display panel away from the display surface by a first connection layer; and
the second heat conductor layer is connected to the side of the first heat conductor layer away from the display panel by a second connection layer.

10. The manufacturing method according to claim 8, wherein before disposing the second heat conductor layer on the side of the first heat conductor layer away from the display panel, the manufacturing method further comprises:
disposing a third heat conductor layer on a sidewall portion of a cover plate for protecting the display panel.

* * * * *